United States Patent [19]
Graf, III

[11] Patent Number: 5,920,213
[45] Date of Patent: *Jul. 6, 1999

[54] PULSE DISCRIMINATING CLOCK SYNCHRONIZER FOR LOGIC DERIVED CLOCK SIGNALS FOR A PROGRAMMABLE DEVICE

[75] Inventor: W. Alfred Graf, III, Saratoga, Calif.

[73] Assignee: Cypress Semiconductor Corp., San Jose, Calif.

[*] Notice: This patent is subject to a terminal disclaimer.

[21] Appl. No.: 08/825,484

[22] Filed: Mar. 28, 1997

[51] Int. Cl.⁶ .................................................. H03K 17/22
[52] U.S. Cl. .......................... 327/144; 327/162; 327/141
[58] Field of Search ..................... 327/141, 144, 327/145, 152, 153, 154, 161, 162, 163, 172, 173, 174, 544

[56] References Cited

U.S. PATENT DOCUMENTS

| | | | |
|---|---|---|---|
| 4,408,333 | 10/1983 | Fujii | 327/161 |
| 4,973,860 | 11/1990 | Ludwig | 327/145 |
| 5,001,374 | 3/1991 | Chang | 327/141 |
| 5,418,407 | 5/1995 | Frenkil | 327/163 |
| 5,572,157 | 11/1996 | Takashi et al. | 327/162 |

*Primary Examiner*—Toan Tran
*Attorney, Agent, or Firm*—Blakely Sokoloff Taylor & Zafman LLP

[57] ABSTRACT

A programmable device includes circuitry for generating an asynchronous logic derived clock signal from one or more of a number of input signals. Circuits for synchronizing the asynchronous logic derived clock signal to be a reference clock signal are coupled to the circuitry for generating. The circuits for synchronizing generate a synchronized logic derived clock signal from the asynchronous logic derived clock signal and the reference clock signal but only when the input signals are recognized as clocking signals. That is, the synchronizing circuits discriminate between valid input signals and spurious signals or noise.

14 Claims, 7 Drawing Sheets

PULSE DISCRIMINATING CLOCK SYNCHRONIZER FOR LOGIC DERIVED CLOCK SIGNALS FOR A PROGRAMMABLE DEVICE

RELATED APPLICATIONS

This application is related to the following co-pending applications, each assigned to the Assignee of the present invention.

Application Ser. No. 08/827,271, filed Mar. 28, 1997, entitled "Fast Clock Generator and Clock Synchronizer for Logic Derived Clock Signals for a Programmable Device"

Application Ser. No. 08/828,434, filed Mar. 28, 1997, entitled "Fast Clock Generator and Clock Synchronizer for Logic Derived Clock Signals with Synchronous Clock Suspension Capability for a Programmable Device".

Application Ser. No. 08/828,325, filed Mar. 28, 1997, entitled "Synchronizing Clock Pulse Generator for Logic Derived Clock Signals for a Programmable Device".

Application Ser. No. 08/828,359, filed Mar. 28, 1997, entitled "Synchronizing Clock Pulse Generator for Logic Derived Clock Signals with Synchronous Clock Suspension Capability for a Programmable Device".

Application Ser. No. 08/828,319, filed Mar. 28, 1997, entitled "Pulse Discriminating Clock Synchronizer for Logic Derived Clock Signals with Synchronous Clock Suspension Capability for a Programmable Device".

Application Ser. No. 08/825,482, filed Mar. 28, 1997, entitled "Asynchronous Pulse Discriminating Synchronizing Clock Pulse Generator for Logic Derived Clock Signals for a Programmable Device".

Application Ser. No. 08/825,489, filed Mar. 28, 1997, entitled "Asynchronous Pulse Discriminating Clock Pulse Generator for Logic Derived Clock Signals with Synchronous Clock Suspension Capability for Programmable Device".

FIELD OF THE INVENTION

The present invention relates to programmable logic devices and, more particularly, to capturing data in a register in response to synchronized logic derived clock signals in a programmable device.

BACKGROUND

Programmable logic devices (PLDs) are popular general purpose logic devices. PLDs generally include an AND array, an OR array and an input/output (I/O) macrocell. A routing interconnect is used to transport signals to various elements within the device. The AND array typically includes a plurality of logical AND gates and generates a large number of output signals called AND or product terms. The AND terms are received by the OR array which generally includes a plurality of OR gates. The OR array generates a number of output signals, called sum terms, by ORing selected AND terms together. The sum terms generated by the OR array are then received by the I/O macrocell which comprises a number of circuit elements including D-type data registers. The I/O macrocell of most PLDs outputs signals from the PLD and also feeds output signals back into the AND array for further use.

Many families of programmable logic devices such as PLDs, complex PLDs (so-called CPLDs), field programmable gate arrays (FPGAs) and application specific integrated circuits (ASICs) are synchronously clocked devices. That is, these families of devices have dedicated pins which receive a system clock signal for use within the programmable logic device. For example, some conventional synchronous programmable logic devices receive clock input signals from dedicated clock/input pins and route such signals to programmable registers within one or more I/O macrocells.

Other families of PLDs can accommodate asynchronous clocking wherein the clock signals which are used to capture data in registers contained in these devices are created by logically combining a number of logic inputs and/or internally generated logic signals to create the clock signal. In these devices, a particular signal generated, for example, by the AND or OR arrays can be utilized, in place of a dedicated system clock, to capture a signal in one of the register elements in an I/O macrocell. This function is termed asynchronous clocking because a signal other than a dedicated system clock is utilized by one or more register elements. Where the asynchronous clock signal is generated by the AND array, the asynchronous clock signal may be referred to as a product term clock signal. Where the asynchronous clock signal is generated by the OR array, it may be referred to as a sum term or a sum of product term if the asynchronous clock signal is generated by a combination of signals provided by the AND and OR arrays.

In architectures where an asynchronous signal is used by one or more register elements in an I/O macrocell as a clock signal, these logically derived clocks signals are restricted to very low frequencies of operation because the asynchronous signals usually must traverse the large general purpose logic array of the CPLD or FPGA. As a result, an input change in the incoming signal(s) from which the logic derived clock signal is created must wait for any proceeding transitions to transit the slow logic array signal path before the subsequent input transitions can be processed. This restriction limits the frequency at which these devices can operate to frequencies much lower than those possible for synchronous operation in which external clock signals are applied directly to a register clock input via fast, dedicated clock signal paths.

In addition, the input signals from which the logic derived clock signal is created can arrive at unpredictable times at the programmable device. The unpredictable signal arrival time may result in a violation in the setup or hold time relative to the data signal to be captured in the register. The difference between logic derived clock signal and data signal transit times through the programmable device can be considerable. Therefore, to ensure that this potential mismatch in signal timing does not cause a violation of the data signal setup time or hold time relative to the logic derived clock signal input to the register, operation must be derated to allow for the worst case difference or skew between the data signal and the logic derived clock signals which can be anticipated in a given CPLD or FPGA due to variations in internal logic placement and routing.

FIG. 1 shows an example of product terms used to create logic derived clock signals in macrocells of a CPLD which are part of a larger logic array of one of the logic blocks of a CPLD. CPLD 10 includes macrocells 12 and logic block logic array 14. Logic block logic array 14 receives a number of signals 16 from a programmable interconnect matrix (PIM) within CPLD 10. The PIM (not shown) acts as a user programmable routing matrix for signals within the device. Signals 16 from the PIM are passed to logic block logic array 14 for routing to one or more macrocells 12. Note that, in general, signals 16 from the PIM include the logic complement of each signal. Thus, for "n" signals, 2n signal lines are present in logic block logic array 14. Likewise, each of the logic gates 18 in logic block logic array will have 2n input lines. For clarity, however, only one input line for each logic gate 18 is shown and this shorthand form of notation is typically employed and understood by those skilled in the art and is used in this application to illustrate exemplary embodiments of the present invention.

One or more of the signals 16 provided to logic block logic array 14 may be combined using dedicated logic gates 19 to produce a product term clock signal 20. Product term clock signal 20 may be used as a logic derived clock signal by a register 22 within one of the macrocells 12. In general, register 22 captures data signals presented on line 29 in response to a rising (or falling) edge of a clock signal (CLK) on clock line 25. Using a multiplexer 24 within macrocell 12, a user can select between product term clock signal 20 or a synchronous clock signal 26 as the means by which data signals can be captured in register 22. Data signals which are captured in register 22 may ultimately be provided to an output pad 28 and/or routed back through logic block logic array 14 or the PIM to form more complex signal combinations.

The product term clock signal 20 shown in FIG. 1 may be responsive to one or more external input signals which can arrive at CPLD 10 at any time from an external system. There is significant risk that these external signals will produce changes at the clock signal input of register 22 which will violate required setup and hold times relative to the data signal supplied on line 29 for capture by register 22. Such an occurrence can cause the wrong data state to be captured by register 22. Also, when setup and hold times are violated there is significant probability that a metastable event can occur which will cause an undesired logic state to be output by register 22 until the metastable event has been resolved. Even though the correct output logic state may eventually be obtained, the time required for recovery from the metastable condition can be much longer than the usual clock input to valid data output delay. Normally, additional margins must be added to the logic derived clock signal period to allow for the resolution of such metastable states. This requirement adds even more delay to the logic derived clock period, lowering the frequency of operation even further.

Also as shown in FIG. 1, if a "sum" expression is required to generate the product term clock signal 20, it must be created in another macrocell 12 and fed back to the input of the clock product term 19. This added pass through logic block logic array 14 reduces even further the possible frequency of operation of the product term clock signal 20.

FIG. 2 shows the generation of logic derived clock signals in the logic cells of an FPGA by routing an output of one logic cell to the clock input of a register which received data from an output of another logic cell. An input signal change which produces a change in the logic derived clock signal can be several logic blocks prior to the clock input of the controlled register.

FPGA 30 may include several logic cells 32a–32d. Logic cell 32a may receive and operate on one or more signals provided from a PIM 34. As illustrated, logic cell 32a receives three input signals 35. The circled interconnections of the inputs 35 within PIM 34 represent programmable elements (e.g., fuses, antifuses, flash cells, RAM cell controlled pass transistors, etc.) which have been programmed so as to route the respective signals to logic cell 32a.

Logic cell 32a may perform one or more operations on the input signals 35 and provide an output signal 36 to PIM 34. This output signal 36 may be one of several input signals 37 to logic cell 32b which performs other operations and produces output signal 38 to PIM 34. Finally, signal 38 may be one of several inputs 39 to logic cell 32c which performs further logical operations and provides data signal 40 to register 41.

Register 41 captures data signal 40 on the rising edge of a logic derived clock signal 42 which is itself received from PIM 34. Logic derived clock signal 42 is produced by logic cell 32d from a number of input signals 43. These input signals 43 may themselves be routed through PIM 34 from other logic cell outputs prior to reaching logic cell 32d. If any of the input signals 43 which are used to create the logic derived clock signal 42 are derived from external asynchronous input signals whose transitions cannot be reliably predicted, no timing precautions will guarantee proper observance of relative data and clock signal timing requirements at the register 48 input.

It should be noted that the transit times for data signals and clock signals are strongly affected by the relative internal locations of the signal sources since FPGAs typically exhibit a wide distribution of internal interconnect delays. Consequently, the relative signal timing of the logic derived clock signal and the data signal is difficult to predict and designs which rely on logic derived clock signals cannot be guaranteed to function reliably. As a result of this timing unpredictability, some FPGAs provide a clock enable which can be used to wait for all the transit delays to occur before enabling the clock signal path to the logic cell register. This approach still requires a delay to be observed to accommodate the worst case possible delay in the clock signal path and the data signal must be held at the data input of the register to allow for this worst case delayed clock enable. This scheme results in very slow performance with logic derived clock signals.

Any logic derived clock signal (e.g., product term clock signal 20 in FIG. 1 or signal 42 in FIG. 2) whose arrival at a controlled register (e.g., register 22 in FIG. 1 or register 41 in FIG. 2) can result in the violation of setup or hold timing relative to the data signal input (e.g., signal 29 in FIG. 1 or signal 40 in FIG. 2) can generate a metastable register state which will frequently require a time longer than a normal clock signal to valid data output delay time to resolve to a stable output state. In the event that the arrival of a logic derived clock signal cannot be predicted, additional timing margins must be provided in the clock signal path to allow for the metastable recovery time to ensure an acceptably low level of probability of a functional failure due to a metastablity event.

Accordingly, what is desired is a means to provide fast logic generated clock signals for use in CPLDs, FPGAs and other programmable devices to allow higher performance logic derived clock frequencies. It is also desirable to have a means for synchronizing the logic derived clock signals to the data so as to eliminate the risk of register data signal and clock signal timing mismatches and to eliminate the potential for metastability-induced functional failures. Further, it is desirable that the synchronized logic derived clock signal be produced only when the input logic signal(s) from which the logic derived clock signal is created is (are) recognized as (a) clocking signal(s) (i.e., as opposed to a spurious signal(s) or noise).

SUMMARY OF INVENTION

In one embodiment, the present invention provides a programmable device which includes means generating an asynchronous logic derived clock signal from one or more of a plurality of input signals. Means for synchronizing the asynchronous logic derived clock signal to a reference clock signal are coupled to the means for generating. The means for synchronizing generate a synchronized logic derived clock signal from the asynchronous clock derived clock signal and the reference clock signal. The synchronized logic derived clock signal is produced only when the input signals which are used to create the asynchronous logic derived clock signal are recognized as clocking signals. That is, the present invention provides a means of rejecting spurious input signals.

BRIEF DESCRIPTION OF THE DRAWINGS

The features and advantages of the present invention are illustrated by way of example in the accompanying drawings which are in no way intended to limit the scope of the present invention to the particular embodiments shown.

DETAILED DESCRIPTION

Described herein is a programmable device which includes a dedicated, fast asynchronous clock logic array (CLA) which can be responsive to a subset of external input signals (or to all external input signals, if desired) and which provides a logic derived clock signal path to a register. The present invention may thereby increase the upper bound on the frequency of operation of logic derived clock signals. Also included in the present invention is an asynchronous clock synchronizer (ACS) which provides a means to synchronize asynchronous, logic derived clock signals to one or more external synchronous clock inputs to the device. The asynchronous, logic derived clock signal may be synchronized to a synchronous clock signal used to capture a data input in an input register. The outputs of the input register may be logically combined with other signals in the programmable device to produce a data signal input into an output register which is responsive to the synchronized logic derived clock signal. Further, the ACS is configured to discriminate between input signals from which the asynchronous logic derived clock signal is created of at least a minimum required and spurious input signals or noise. Although described with reference to a CPLD architecture, those skilled in the art will recognize that the present invention is equally applicable for use in PLDs, FPGAs, ASICs or other programmable devices. Accordingly, the embodiments described below should be regarded as illustrative only.

Figure 3:
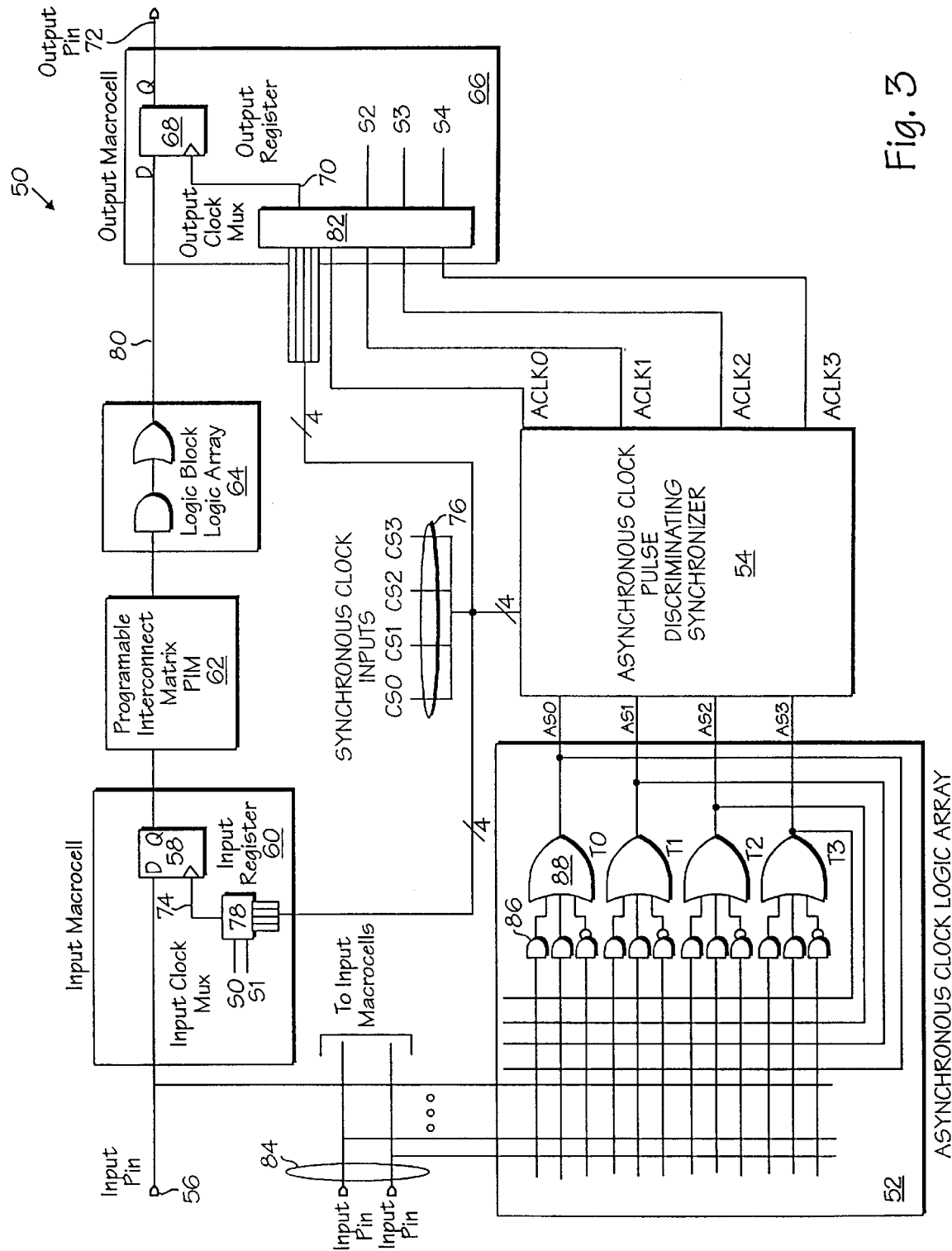
FIG. 3 illustrates a dedicated, asynchronous clock logic array and an associated asynchronous logic derived clock signal synchronizer/clock pulse discriminator according to one embodiment of the present invention.

FIG. 3 illustrates a programmable device 50 which includes an asynchronous clock logic array (CLA) 52 and an asynchronous logic derived clock signal synchronizer (ACS)/clock pulse discriminator 54. Data signals provided on an input pin 56 are captured in an input register 58 of an input macrocell 60. Output signals from the input register 58 are routed through a programmable interconnect matrix (PIM) 62 to a logic block logic array 64 which may include logical AND terms and/or logical OR terms. The signals from register 58 are combined with other signals in device 50 in logic block logic array 64 to produce a resulting data signal on line 80 for presentation to output macrocell 66. The data signal so provided is captured in register 68 on the rising edge of a clock signal on output clock line 70, and passed to output pin 72. Alternatively, or in addition, the signal captured by register 68 may be routed back through PIM 62 and/or logic block logic array 64 to be combined with other signals to form more complex signals (these possible signal paths have not been shown in FIG. 3 so as not to overly complicate the drawing). It is important that the clock signal on output clock line 70 be provided to register 68 at a time when the data signal from logic block logic array 64 is valid. Otherwise, invalid data may be latched or a metastable condition may result.

The data signal on input pin 56 may be captured in register 58 on the rising edge of a clock signal provided on input clock line 74. This clock signal is typically an external synchronous clock signal and may be one of several such synchronous clock signals 76 provided to programmable device 50. For the embodiment illustrated in FIG. 3, four synchronous clock signals 76 (CS0–CS3) are provided to programmable device 50. In other embodiments, more or fewer synchronous clock signals 76 may be so provided. Input clock select multiplexer (mux) 78 controls which of the synchronous clock signals 76 are provided to register 58. As will be discussed in further detail below, the synchronous clock signal provided to register 58 on input clock line 74 will be delayed from the respective one of synchronous clock signals 76 by a time associated with a propagation delay through clock select mux 78.

Output register 68 captures a data signal on line 80 provided by logic block array 64. This data signal will be valid at a time dependent upon propagation delays associated with register 58, PIM 62 and logic block logic array 64. The data signal on line 80 may be captured in register 68 on the rising edge of an output clock signal on output clock line 70. The output clock signal may be one of the synchronous clock signals 76 or one of a number of synchronized logic derived clock signals ACLK0–ACLK3 provided to output clock select mux 82. Regardless of which signal is selected as the output clock signal it is important that the output clock signal be provided to register 68 at a time when the data signal on line 80 is valid, otherwise invalid data will be captured or a metastable state may result.

Figure 1:
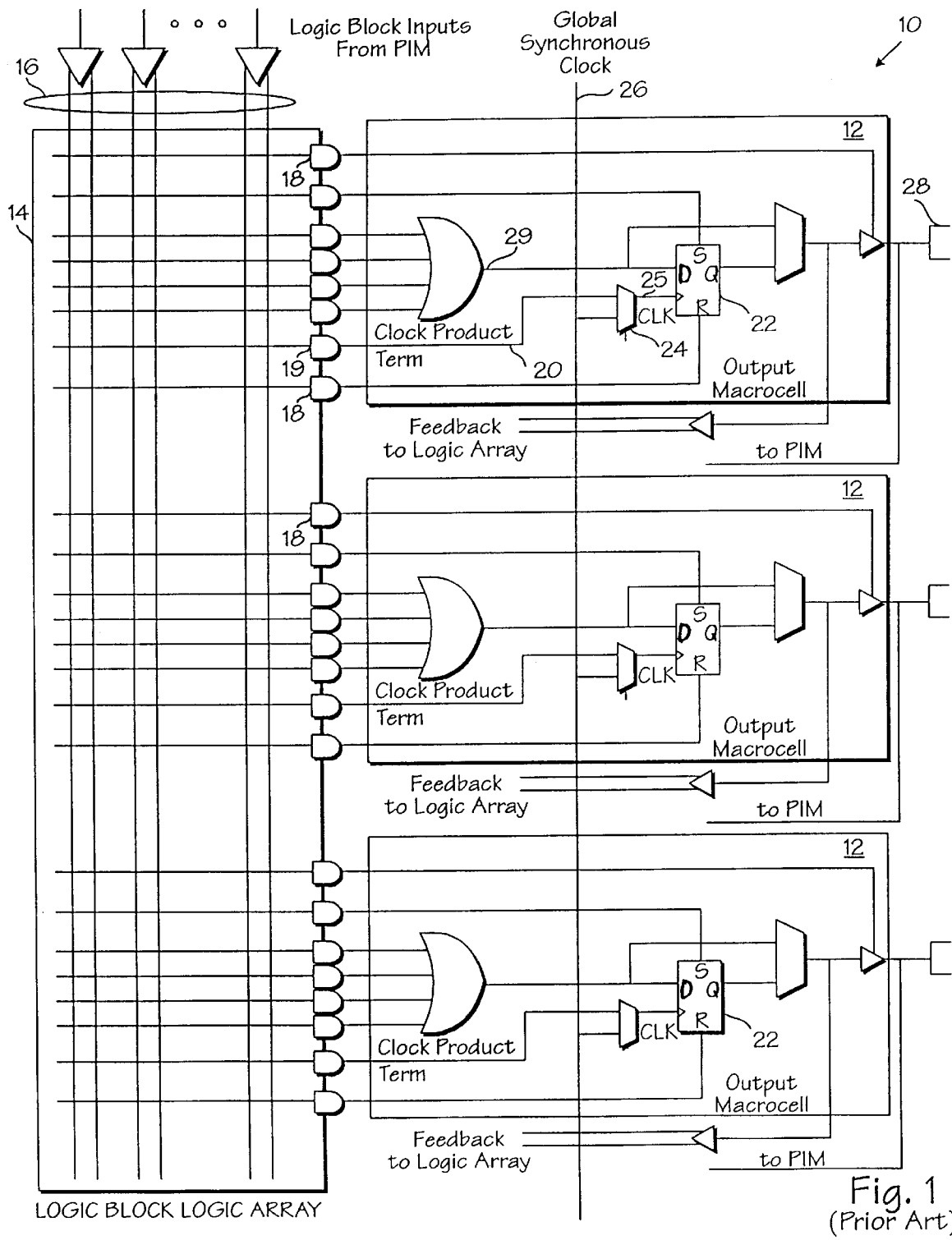
FIG. 1 illustrates the use of product term or asynchronous logic derived clock signals in macrocells of a conventional programmable device.
Figure 2:
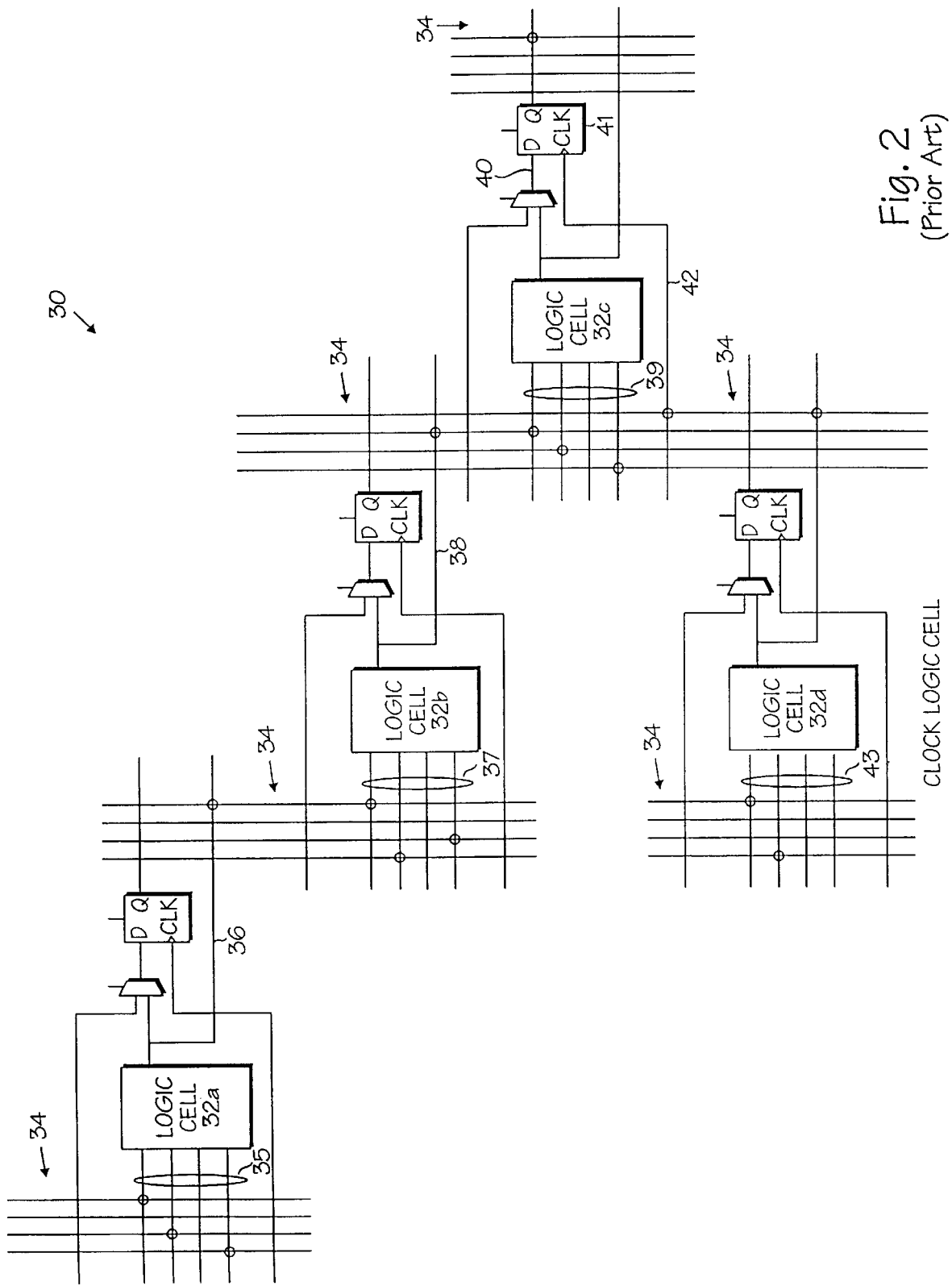
FIG. 2 illustrates the generation of logic derived clock signals in logic cells of a conventional FPGA.

Synchronized logic derived clock signals ACLK0–ACLK3 are produced by CLA 52 and ACS 54 in response to one or more input signals 84 and external synchronous clock signals 76. Input signals 84 may be one or more logic signals provided to programmable device 50. These input signals 84 are provided directly to CLA 52 without being routed through PIM 62 or logic block logic array 64. Thus, propagation delays which were present in the logic derived clock signals discussed with reference to FIGS. 1 and 2 are avoided. This helps to increase the frequency at which registers such as register 68 may capture data signals using logic derived clock signals may operate.

Asynchronous clock logic array (CLA) 52 is illustrated as including a number of logic gates 86 and 88. Logic gates 86 may have 2n inputs, where n indicates the number of inputs signals 84 provided to CLA 52. There are 2n inputs to logic gates 86 because each input signal 84 and/or its logic compliment may be logically combined in logic gates 86 to produce intermediate signals. These intermediate signals may be logically combined by one or more logic gates 88 to produce one or more asynchronous (product or sum term) logic derived clock signals. The same drawing shorthand used in FIG. 1 is used here.

Figure 4:
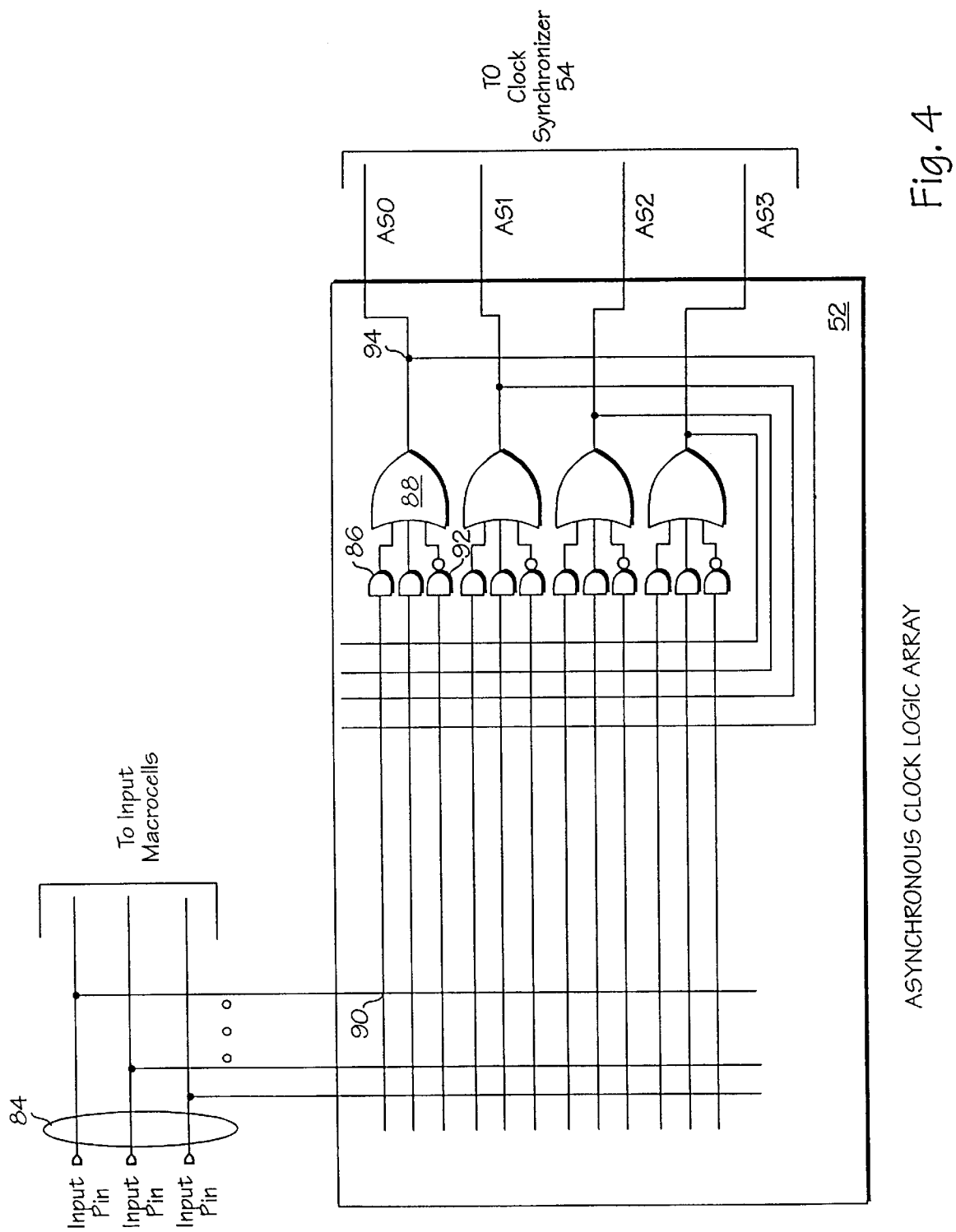
FIG. 4 illustrates one possible configuration of an asynchronous clock logic array for use according to one embodiment of the present invention.

FIG. 4 further illustrates CLA 52 in more detail. Again, the drawing shorthand discussed with reference to FIG. 1 is used here so as not to unnecessarily obscure the illustration. CLA 52 logically combines a subset (or all) of input signals 84 and/or their logic compliments using logic gates 86 and 88 to produce asynchronous logic derived clock signals AS0–AS3. Although CLA 52 is illustrated as being capable of providing four asynchronous logic derived clock signals, in other embodiments CLA 52 may be configured to provide fewer (e.g., 1–3, preferably 2–3) or more (e.g., $\geq 5$, preferably 5–64 or more preferably $2^n$, where $n \geq 3$ and preferably $3 \leq n \leq 6$) asynchronous logic derived clock signals.

The number of input signals 84 which are combined to produce any of asynchronous logic derived clock signals AS0–AS3 is user selectable. The interconnection nodes, such as node 90, within CLA 52 are programmable, for example through the use of antifuses, fuses, flash cells, EPROM cells, RAM cells (e.g., refer to co-pending application Ser. No. 08/805,890, filed Mar. 3, 1997, entitled "Self-Initializing RAM Based Programmable Device") or other programmable elements. In this way, asynchronous logic derived clock signals AS0–AS3 produced by CLA 52 can be tailored to suit the required operation. CLA 52 may also provide a number of NAND terms 92. These NAND terms 92 allow for logical OR functions which those skilled in the art will recognize may be realized by DeMorganizing the logical complements of selected input signals 84. In this way, a "sum" term signal including more than three input terms may be provided without the need for a second pass through a logic array as was required for the apparatus illustrated in FIG. 1. Further, CLA 52 provides feedback paths, for example via node 94, which may allow product term (or sum of product term) signals to be combined with further sets or subsets of input signals 84 to produce even more logically complex asynchronous logic derived clock signals AS0–AS3.

Figure 5:
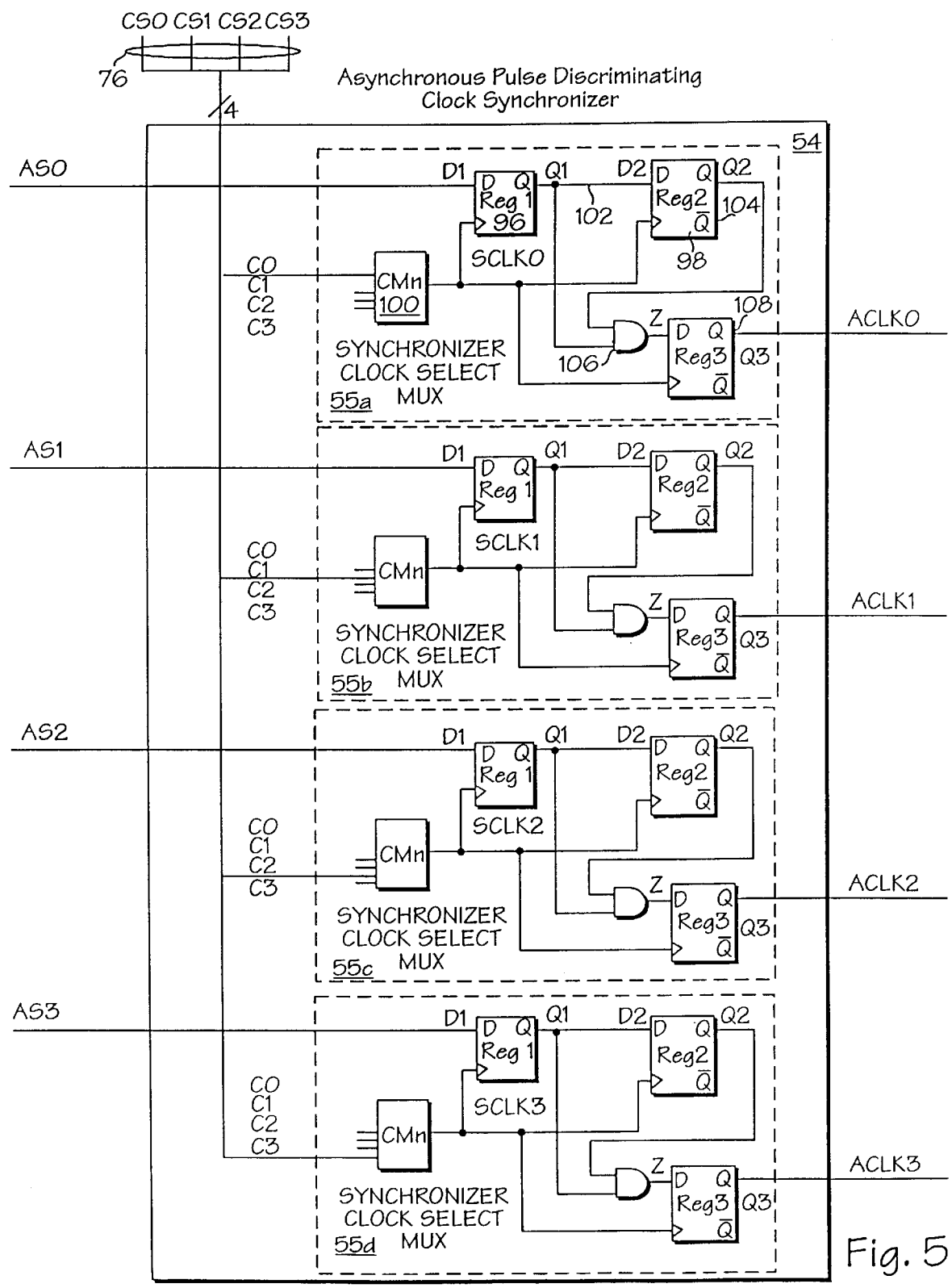
FIG. 5 illustrates one possible asynchronous logic derived clock signal synchronizer/clock pulse discriminator for use according to one embodiment of the present invention.

FIG. 5 further illustrates ACS 54. Asynchronous clock synchronizer (ACS) 54 receives as inputs, asynchronous logic derived clock signals AS0–AS3 and synchronizes one or more of these signals, each to a selected one of external synchronous clock signals 76 to produce synchronized logic derived clock signals ACLK0–ACLK3. Although illustrated as capable of accommodating four input asynchronous logic derived clock signals AS0–AS3, in other embodiments ACS 54 may accommodate more or fewer asynchronous logic derived clock inputs. Likewise, although the illustrated embodiment receives four external synchronous clock signals 76 (CS0–CS3), other embodiments may accommodate more or fewer such signals, depending upon the requirements of programmable device 50. Of course, ACS 54 may also be configured to provide more (e.g., $\geq 5$, preferably 5–64 or more preferably $2^n$ where $n \geq 3$ and preferably where $3 \leq n \leq 6$) or fewer (e.g., 1–3, preferably 2–3) synchronized logic derived clock signals than the illustrated ACLK0–ACLK3.

Asynchronous clock synchronizer 54 includes blocks 55a–55d, each of which includes synchronizing registers 96 and 98 and synchronous clock select multiplexers 100. For the illustrated embodiment, synchronizing registers 96 and 98 are D-type data registers, however, those skilled in the art will appreciate that other registers could be utilized with appropriate logic. Also included in each block 55a–55d are AND gates 106 and pulse discriminator registers 108. In operation, an asynchronous logic derived clock signal, e.g., AS0 for block 55a, is provided from CLA 52 to the input of a first synchronizing register 96. This asynchronous logic derived clock signal is captured in register 96 on the rising edge of a synchronous clock signal SCLK0 (provided by clock select mux 100), to produce a first intermediate signal on line 102. The first intermediate signal is itself captured in register 98 on the next rising edge of SCLK0 to provide a second intermediate signal on line 104. The first and second intermediate signals are logically combined in AND gate 106 to produce a third intermediate signal which is captured in register 108 on a rising edge of SCLK0 to provide synchronized logic derived clock signal ACLK0. The other synchronized logic derived clock signals ACLK1–ACLK3 are similarly produced by synchronizing other asynchronous logic derived clock signals AS1–AS3, each to one of the synchronous clock signals (CS0–CS3) 76.

Multiplexers 100 provide means for selecting one of synchronous clock signals CS0–CS3. An appropriate one of the synchronous clock signals 76 is selected using mux control signals to provide a delayed synchronous clock signal SCLK0–SCLK3. Note that because the propagation delay through multiplexer 100 is approximately the same as the propagation delay through input clock select mux 78 of input macrocell 60, the resulting delayed synchronous clock signal SCLK0–SCLK3 will be time shifted from a selected synchronous clock signal CS0–CS3 by approximately the same time as the clock signal presented to register 58 on input clock line 74. The external synchronous clock signal used to capture an input data signal in register 58 will typically be the same synchronous clock signal used by ACS 54 to synchronize one of the asynchronous logic derived clock signals AS0–AS3 to provide one of the synchronized logic derived clock signals ACLK0–ACLK3 for use by register 68 in output macrocell 66.

Figure 6:
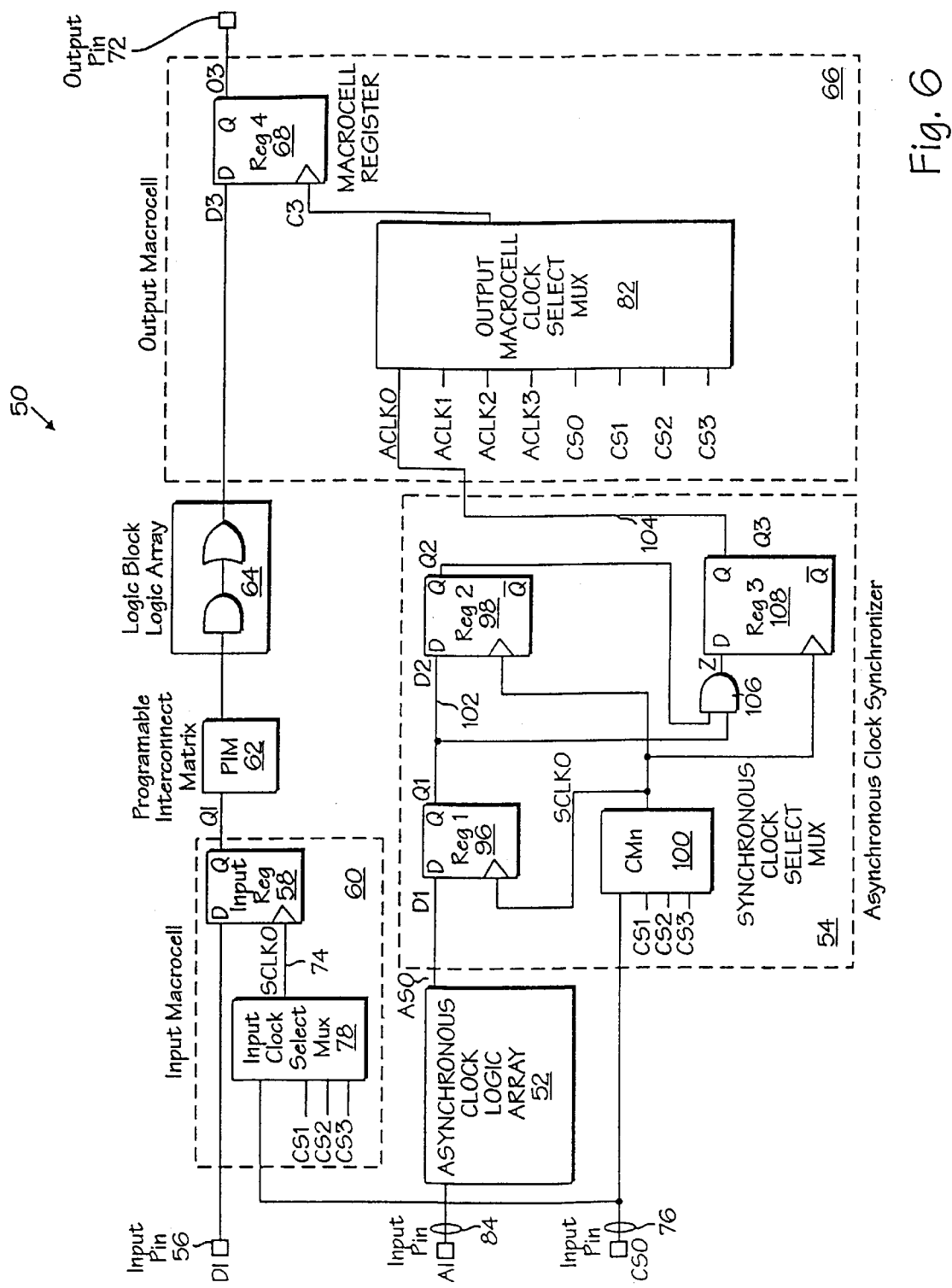
FIG. 6 illustrates signal paths for a data signal and a logic derived clock signal to an output macrocell register in a programmable device according to a further embodiment of the present invention.

The operation of programmable device 50 is more fully described with reference to the signal path diagram of FIG. 6 and the timing diagram of FIG. 7. FIG. 6 shows the signal paths for a data input signal DI applied to input pin 56 to be captured in register 58 and subsequently in register 68 by a synchronized logic derived clock signal C3 which is produced from an input logic signal AI. Although only a single input signal AI is illustrated, it should be recognized that signal AI may be a combination of a number of input signals 84 as illustrated in FIGS. 3 and 4. Synchronized logic derived clock signal C3 is produced only when input signal(s) AI has (have) a sufficient minimum duration to be recognized as (a) clocking signal(s). That is, spurious input signals or noise are rejected and will not lead to spurious operation of register 68 in response to invalid input signals. The input signal DI is processed through programmable device 50, as described below, to produce a data signal D3 on line 80 to be captured in output register 68 in output macrocell 66. Data signal D3 is captured in output register 68 on the rising edge of clock signal C3 so it is important that clock signal C3 be provided at a time when data signal D3 is valid. The manner in which this synchronization of signals is achieved in programmable device 50 is discussed with reference to the timing diagram of FIG. 7.

Figure 7:
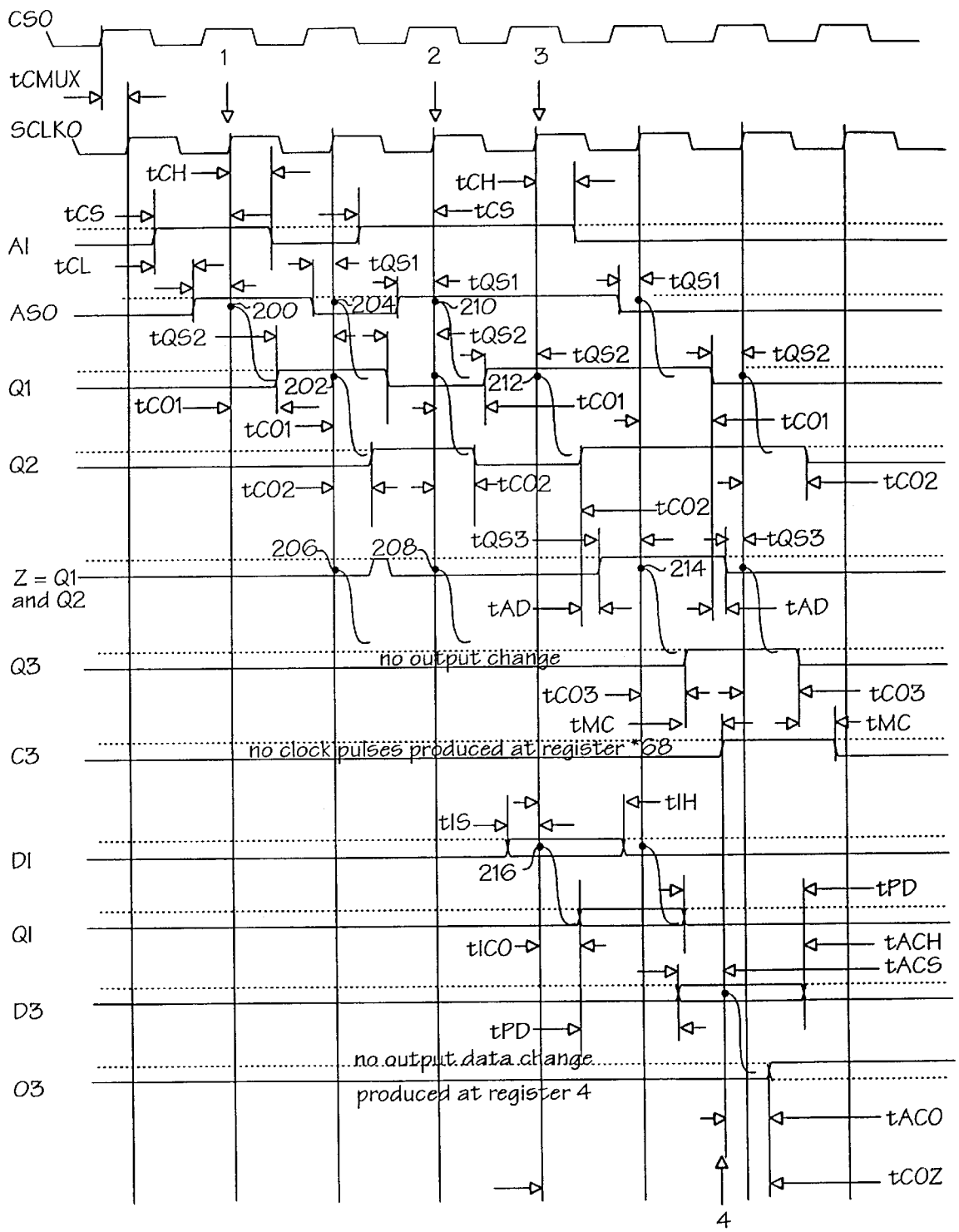
FIG. 7 is a timing diagram illustrating the operation of the embodiment shown in FIG. 6.

FIG. 7 shows the timing for the synchronizing of a logic derived clock signal which ensures the reliable capture of data in output register 68 regardless of the time of arrival of the external signal changes AI which control the logic derived clock signal. As will become apparent, data may be captured in register 68 on every third clock cycle of an external synchronous clock signal at the data input, DI, with a logic derived clock signal which is created via an external input signal transition on input(s) AI of CLA 52. The frequency at which data can be processed by the logic derived clock signal C3 is one third the frequency of the external synchronous clock signal CS0. In FIGS. 6 and 7, it is assumed that synchronous clock signal CS0 is used to capture data signal DI in input register 58 and is therefore also used to synchronize the asynchronous logic derived clock AS0 for use by output register 68. For this reason, only one synchronous clock input signal, CS0, and a single set of synchronizing registers 96 and 98 have been illustrated. However, it should be appreciated that this embodiment is merely one possible configuration of the programmable device 50 more explicitly illustrated in FIGS. 3–5 and is provided for purposes of explanation and not limitation.

The generation of the synchronized logic derived clock signal ACLK0 will be discussed first. One or more input logic signal(s) AI is (are) provided to CLA 52 which produces asynchronous logic derived clock signal AS0 as described above with reference to FIGS. 3 and 4. As shown in FIG. 7, asynchronous logic derived clock signal AS0 is delayed from input logic signal(s) AI by a time $t_{CL}$, a maximum possible propagation delay associated with CLA 52.

FIG. 7 illustrates two situations: First, as shown at the left of the timing diagram, an input signal AI with duration of approximately one clock cycle of the synchronous clock signal, SCLK0, is applied to the input of CLA 52. Second, as shown by the succeeding waveform patterns, an input signal AI with duration of approximately two clock cycles of SCLK0 is applied to the input of CLA 52. As is apparent from the illustration, input signal AI must be held at a logic HIGH for at least two clock cycles (i.e., two consecutive rising edges) of the synchronous clock, SCLK0, to produce a synchronized logic derived clock signal (i.e., pulse) C3. Register 108 in ACS 54 implements a pulse discriminator which will create a synchronized version of the asynchronous logic derived clock signal (e.g., AS0) only when a logic HIGH state of the signal is captured by synchronizing register 96 on two successive rising edges of SCLK0. When this occurs, AND gate 106 combines the logic HIGH signals Q1 and Q2, from the outputs of registers 96 and 98 respectively, and the resulting logic HIGH state is captured by register 108. This scheme ensures that a momentary one cycle excursion of the input signal AI (e.g., a spurious signal or noise) is not interpreted as a true input signal state transition. In other words, input signals AI of duration less than two clock cycles of the synchronous clock SCLK0 are rejected.

Consider first the case where AI is a single cycle pulse, as shown at the left of FIG. 7. Asynchronous logic derived clock signal AS0 is provided as input signal D1 to a first synchronizing register 96 in ACS 54. Synchronizing register 96 captures signal D1 on the rising edge of delayed synchronous clock signal SCLK0 which is provided by synchronous clock select mux 100. As shown in FIG. 7, SCLK0 is a synchronous clock signal time delayed from input synchronous clock signal CS0 by a time $t_{CMUX}$, a propagation delay associated with mux 100. Asynchronous logic derived clock signal AS0 is captured on a rising edge of SCLK0, transition point 200 in FIG. 7, to produce intermediate signal Q1 at the output of the first synchronizing register 96. Note that Q1 is delayed from transition point 200 (corresponding to the time of a rising edge of SCLK0) by a propagation delay $t_{CO1}$, the maximum possible delay associated with register 96.

Intermediate signal Q1 is provided as an input signal D2 to a second synchronizing register 98. Synchronizing register 98 captures intermediate signal Q1 on the next rising edge of SCLK0, transition point 202 in FIG. 7. This produces intermediate signal Q2, which is delayed by a propagation delay $t_{CO2}$ associated with register 98. At this same time, however, asynchronous logic derived clock signal AS0 is again captured in register 96 (transition point 204). Because the input signal AI was only one cycle in duration, at transition point 204 asynchronous logic derived clock signal AS0 is now a logic LOW. This LOW state is captured by register 96 and signal Q1 transitions to a logic LOW after a propagation delay time $t_{CO1}$. Intermediate signal Q2 is logically combined with intermediate signal Q1 in AND gate 106 to produce intermediate signal Z. Note that there is a propagation delay $t_{AD}$ associated with AND gate 106. Intermediate signal Z is captured in register 108 on the same rising edge of SCLK0 as intermediate signal Q1 is captured in register 98 (see transition point 202 and 206). This produces output signal Q3 which is the synchronized logic derived clock signal ACLK0 which is provided by ACS 54 to output clock select mux 82.

Notice in FIG. 7 that when intermediate signal Z is captured in register 108 at transition point 206, Z is a logic LOW. This is because at transition point 206, intermediate signal Q2 has not yet transitioned to a logic HIGH due to the propagation delay $t_{CO2}$ associated with register 98. Signal Z may rise to a logic HIGH for a brief period following transition point 206 (due to propagation delay $t_{CO1}$ associated with register 96 being greater than tCo2 associated with register 98, however, by the next rising edge of SCLK0, at transition point 208, Z is again LOW. This is because by transition point 208, Q1 has again transitioned to a logic LOW as discussed above. Thus, when input signal AI is only a single clock cycle (of synchronous clock signal SCLK0) in duration, ACS 54 acts as a pulse discriminator and the output synchronized logic derived clock signal ACLK0 (i.e., C3) does not change state.

Consider now the case where input signal AI remains logic HIGH for two consecutive rising edges of SCLK0. As shown in FIG. 7, when signal AI transitions to a logic HIGH, asynchronous logic derived clock signal AS0 is produced by CLA 52 following a time delay of $t_{CL}$. The logic HIGH state of AS0 is captured at a transition point 210, by a rising edge of SCLK0, in register 96 and intermediate signal Q1 transitions to a logic HIGH following a propagation delay $t_{CO1}$. The logic HIGH state of Q1 is captured by register 98 on the next rising edge of SCLK0, at transition point 212, and intermediate signal Q2 rises to a logic HIGH after a propagation delay $t_{CO2}$.

Notice that when Q2 transitions to a logic high after transition point 212, intermediate signal Q1 is also HIGH. This is because AI (and, hence, AS0) has remained HIGH for the two consecutive rising edges of SCLK0 corresponding to transition points 210 and 212. Accordingly, intermediate signal Z, the logical AND of Q1 and Q2, now rises to a logic HIGH after a propagation delay $t_{AD}$ and this state is captured by register 108 at transition point 214, the next rising edge of SCLK0 (i.e., the third rising edge of SCLK0 in the sequence). Register 108 produces output signal Q3 (i.e., synchronized logic derived clock signal ACLK0) after a propagation delay $t_{CO3}$. As can be seen from FIG. 7, an input signal AI which is HIGH for two consecutive rising edges of the synchronous clock signal SCLK0 will result in signal Q3 being a single cycle pulse.

Output clock select mux 82 provides clock pulse C3 which is delayed from synchronized logic derived clock signal ACLK0 (i.e., output signal Q3) by a time $t_{MC}$, the maximum possible propagation delay associated with mux 82. In this way, a synchronized logic derived clock pulse is provided to output register 68 to allow capture of a data signal on line 80.

The manner in which the data signal on line 80 (i.e., data signal D3) is produced is as follows. Data input signal DI on input pin 56 is captured by register 58 on the rising edge of synchronous clock signal SCLK0 on input clock line 74. Notice that synchronous clock signal SCLK0 is the synchronous clock signal CS0 time delayed by a time $t_{CMUX}$, a propagation delay associated with input clock select mux 78. This is the same SCLK0 that was used to synchronize asynchronous logic derived clock signal AS0 as discussed above. Accordingly, input clock select mux 78 and synchronous clock select mux 100 are selected such that the two devices provide similar propagation delays. It will be recognized that this may be achieved in one embodiment by using a single synchronous clock select mux which provides a selected input synchronous clock signal SCLK0 to both input register 58 and ACS 54.

As shown in FIG. 7, data input signal DI is captured in input register 58 on the same rising edge of SCLK0 as intermediate signal Q1 is captured in register 98 (see transition point 212 and 216). This is the same transition point corresponding to the second sucessive rising edge of SCLK0 for which synchronous logic derived clock signal Aso is valid (HIGH) This produces output signal QI at the output of register 58 after an associated propagation delay through register 58 of time $t_{ICO}$. Output signal QI is routed through PIM 62 and combined with other signals in device 50 in logic block logic array 64 to produce data signal D3, delayed by a time $t_{PD}$, the propagation delay associated with PIM 62 and logic block logic array 64.

Notice that the relative timings of the signals in programmable device 50 are such that data signal D3 is valid at transition point 218 which corresponds to the rising edge of logic derived clock pulse C3. As a result, valid data is captured in register 68 to produce output signal O3 after an associated propagation delay $t_{ACO}$.

For the clock synchronizing scheme to work reliably the upper bound on the frequency of the synchronous clock, SCLK0, to which the logic derived clock, AS0, can be synchronized should be consistent with the timing restrictions set forth below. The definitions of the timing parameters used in the equations for the timing restrictions are as follows: (See FIGS. 6 and 7)

$t_{PA}$=the minimum possible clock period at which data can be processed by the logic derived clock signal C3 which is synchronized to the external synchronous clock signal, SCLK0.

$t_{PS}$=the minimum clock period of synchronous clock waveform SCLK0 which still achieves synchronization of the asynchronous logic derived clock input, e.g., AS0, to synchronous clock signal SCLK0.

$t_{CL}$=the maximum possible propagation delay for an input signal AI to asynchronous clock logic array 52 to propagate through the CLA 52.

$t_{QS1}$=the minimum required input data setup time relative to the clock input, SCLK0, to guarantee capture of valid data in register 96.

$t_{CO1}$=the maximum possible delay from synchronous clock input, SCLK0, to valid output Q1 for register 96.

$t_{QS2}$=the minimum required input data setup time relative to the synchronous clock input, SCLK0, to guarantee capture of valid data in register 98.

$t_{CO2}$=the maximum possible delay from synchronous clock input, SCLK0, to valid output Q2 for register 98.

$t_{QS3}$=the minimum required input data setup time relative to the synchronous clock input SCLK0, to guarantee capture of valid data in register 108.

$t_{CO3}$=the maximum possible delay from synchronous clock input, SCLK0, to valid output for register 108.

$t_{MC}$=the maximum possible propagation delay for the synchronized logic derived clock signal ACLK0 to propagate through the output macrocell clock selection mux 82 to the clock input of the output register 68.

$t_{PD}$=the maximum possible propagation delay for the signal QI in FIG. 6 to propagate through the programmable interconnect matrix 62 and logic block logic array 64 to the data input of the output register 68.

$t_{CS}$=the minimum required logic signal (e.g., signal AI) setup time at the input of CLA 52 relative to the synchronous clock signal input, SCLK0, for register 96 to guarantee transit of the CLA 52 and adequate time to meet setup time $t_{QS1}$ at the data input of register 96 to guarantee capture of the desired logic derived clock state in register 96.

$t_{CH}$=the minimum required logic signal (e.g., signal AI) hold time at the input of CLA 52 relative to the synchronous clock signal input, SCLK0, for register 96 considering transit of the CLA 52 and adequate to meet input data hold time at the data input of register 96 to guarantee capture of the desired logic derived clock state in register 96.

$t_{IS}$=the minimum required input data signal setup time relative to the synchronous clock input, SCLK0, to guarantee capture of valid data DI at the data input of the input register 58.

$t_{IH}$=the minimum required input data signal hold time relative to the synchronous clock input, SCLK0, to guarantee capture of valid data DI at the data input of the input register 58.

$t_{ICO}$=the maximum possible delay from clock input, SCLK0, to valid output QI for the input register 58.

$t_{ACS}$=the minimum required input data signal setup time relative to the synchronized logic derived clock input signal at output register 68 to guarantee capture of valid data D3 at the data input of the output register 68.

$t_{ACH}$=the minimum required input data signal hold time relative to the synchronized logic derived clock input signal C3 at output register 68 to guarantee capture of valid data D3 at the data input of the output register 68.

$t_{ACO}$=the maximum possible delay from synchronized logic derived clock input signal C3 at output register 68 to valid output data O3 at the output register 68.

$t_{AD}$=the input to output propagation delay for AND gate 106.

Timing constraints required to guarantee synchronization of asynchronous logic derived clock signal AS0 with synchronous clock signal SCLK0 are determined in accordance with the following equations.

1. $t_{PS} > \text{or} = t_{CL} + t_{QS1}$
2. $t_{PS} > \text{or} = t_{CH} + t_{CL} + t_{QS1}$
3. $t_{PS} > \text{or} = t_{CO1} + t_{QS2}$
4. $t_{PS} > \text{or} = t_{IS} + t_{IH}$
5. $t_{PS} > \text{Or} = t_{CO1} + t_{AD} + t_{QS3}$
6. $t_{PS} > \text{or} = t_{CO2} + t_{AD} + t_{QS3}$
7. $t_{PS} + t_{CO3} + t_{MC} > \text{or} = t_{ICO} + t_{PD} + t_{ACS}$
8. $t_{PA} > \text{or} = 3(t_{PS})$ The minimum possible clock period for synchronous clock signal SCLK0 is determined by the largest required $t_{PS}$ determined by constraints 1 through 7 above. The minimum period between data captures by the synchronized logic derived clock signal ACLK0 is determined by constraint 8 above.

For input data DI which is applied to input register 58 early enough to satisfy the $t_{IS}$ setup time relative to a rising edge of synchronous clock signal SCLK0 at time 3 (transition point 216 in FIG. 7), the resultant data signal D3 will be captured in the output register 68 by the rising edge of synchronized logic derived clock signal C3 at time 4 (transition point 218 in FIG. 7) if the asynchronous logic derived clock signal source signal(s) AI has (have) been applied to the input of asynchronous clock logic array 52 a setup time $t_{CS}$ before the immediately previous rising edge of synchronous clock signal SCLK0 at time 2 (transition point 210 in FIG. 7). Setup time $t_{CS}$ for asynchronous input signal(s) AI allow(s) for CLA 52 transit time $t_{CL}$ and for register 96 setup time $t_{QS1}$, allowing the resulting asynchronous logic derived clock signal AS0 to be captured in the first synchronizing register 96. The subsequent synchronizing register 98 allows for metastability events which may result from violation of setup and hold times due to unpredictable arrival of the asynchronous clock logic array 52 input signal(s) AI. Data D3 to be captured in the output register 68 by the synchronized logic derived clock signal C3 can be captured in the input register 58 on every third rising edge of the of the synchronous clock signal SCLK0, providing an asynchronous data rate of one third the synchronous clock frequency $1/t_{PS}$ (maximum asynchronous data rate is $\frac{1}{3}t_{PS}$).

If one wishes to ensure capture of input data DI in output register 68 by asynchronous input signal AI, the input data DI can be held at the input for three consecutive synchronous clock rising edges (SCLK0) to insure against the asynchronous input signal (AI) failing to be captured on the first rising edge of SCLK0 at time 2 (transition point 210 in FIG. 7). Asynchronous input signal AI must be held logic HIGH for a minimum of two consecutive rising edges of the synchronous clock signal SCLK0. This prevents an unintentional positive transient on the input signal AI from generating a spurious synchronized logic derived clock signal. AND gate 106 and register 108 capture the overlap of the outputs of the two synchronizing registers 96 and 98 at the next rising edge of the synchronous clock signal SCLK0. This overlap cannot occur unless the intermediate signal QI from register 96 remains logic HIGH for two successive rising edges of synchronous clock signal SCLK0. Thus, the present invention rejects spurious logic HIGH signals (e.g., noise) on the input signal line to ACS 52. The synchronized logic derived clock signal is produced only when the input logic signals are recognized as clocking signals.

Thus, a means for providing a fast logic generated clock pulse for use in programmable devices to allow higher performance logic derived clocking frequencies and for synchronizing logic derived clock signals to a synchronous data clock to eliminate the risks of register data and clock timing mismatch has been described. Although discussed with reference to specific illustrated embodiments, it should be appreciated that the present invention is applicable to wide numbers of programmable devices, including PLDs, CPLDs, FPGAs, and ASICs. In addition, it should be recognized that the polarity of signal AI could be reversed (with the addition of suitable logic) so that the asynchronous logic derived clock signal would be responsive to a negative going pulse (i.e., a falling edge). Accordingly, the above discussed embodiments and accompanying diagrams should be regarded as illustrative only and the present invention should in no way be limited thereby.

What is claimed is:

1. A method of synchronizing an asynchronous logic derived clock signal with a data signal in a programmable device, comprising the steps of:

capturing an input signal in said programmable device in response to a first clock pulse of a reference clock signal to produce said data signal;

synchronizing said asynchronous logic derived clock signal with said reference clock signal to produce a synchronized logic derived clock signal, said asynchronous logic derived clock signal having at least a minimum duration with respect to said reference clock signal; and capturing said data signal in a register of said programmable device in response to said synchronized logic derived clock signal.

2. A method as in claim 1 wherein synchronizing said asynchronous logic derived clock signal with said reference clock signal includes:

generating said asynchronous logic derived clock signal as a logical combination of a plurality of input signals using one or more logic gates.

3. A method as in claim 2 wherein synchronizing said asynchronous logic derived clock signal with said reference clock signal further includes:

capturing said asynchronous logic derived clock signal in a first register on a first clock pulse of said reference clock signal to produce a first intermediate signal;

capturing said first intermediate signal in a second register on a second clock pulse of said reference clock signal to produce a second intermediate signal; and capturing a third intermediate signal in a third register on a third clock pulse of said reference clock signal to produce said synchronized logic derived clock signal, said third intermediate signal being a logical combination of said first intermediate signal and said second intermediate signal.

4. A method as in claim 3 wherein said logical combination of said first intermediate signal and said second intermediate signal is a logical AND.

5. A method as in claim 4 wherein said minimum duration is at least two clock cycles of said reference clock signal.

6. A method as in claim 1 wherein said step of synchronizing comprises the steps of:

capturing said asynchronous logic derived clock signal in a first synchronizing register in response to a second clock pulse of said reference clock signal immediately prior to said first clock pulse of said reference clock signal to produce a first intermediate signal;

capturing said first intermediate signal in a second synchronizing register in response to said first clock pulse of said reference clock signal to produce a second intermediate signal; and capturing a logical combination of said first and second intermediate signals in a third register in response to a third clock pulse of said reference clock signal immediately following said first clock pulse to produce said synchronized logic derived clock signal.

7. A method as in claim 6 wherein said asynchronous logic derived clock signal is produced from one or more asynchronous input signals to said programmable device.

8. A method as in claim 7 wherein said asynchronous logic derived clock signal is one of a sum term, a sum of products term, a product term or a NAND term of said asynchronous input signals.

9. A method as in claim 7 wherein said logical combination of said first and second intermediate signals is a logical AND.

10. A circuit comprising:

a first register configured to capture an input signal in a programmable device in response to a first clock pulse of a reference clock signal to produce a data signal;

circuitry configured to synchronize an asynchronous logic derived clock signal with said reference clock signal to produce a synchronized logic derived clock signal, said asynchronous logic derived clock signal having at least a minimum duration with respect to said reference clock signal; and a second register configured to capture said data signal in response to said synchronized logic derived clock signal.

11. A circuit as in claim 10 wherein said synchronizing circuitry comprises:

a first synchronizing register configured to capture said asynchronous logic derived clock signal in response to a second clock pulse of said reference clock signal immediately prior to said first clock pulse of said reference clock signal to produce a first intermediate signal;

a second synchronizing register configured to capture said first intermediate signal in response to said first clock pulse of said reference clock signal to produce a second intermediate signal; and a third register configured to capture a logical combination of said first and second intermediate signals in response to a third clock pulse of said reference clock signal immediately following said first clock pulse to produce said synchronized logic derived clock signal.

12. A circuit as in claim 11 wherein said asynchronous logic derived clock signal is produced from one or more asynchronous input signals to said programmable device.

13. A circuit as in claim 12 wherein said asynchronous logic derived clock signal is one of a sum term, a sum of products term, a product term or a NAND term of said asynchronous input signals.

14. A circuit as in claim 12 wherein said logical combination of said first and second intermediate signals is a logical AND.

* * * * *